US010775421B2

(12) United States Patent
Waffner et al.

(10) Patent No.: US 10,775,421 B2
(45) Date of Patent: Sep. 15, 2020

(54) MEASURING TRANSDUCER FOR ELECTRIC VEHICLES AND A METHOD OF OPERATING A MEASURING TRANSDUCER

(71) Applicants: Jürgen Waffner, Essen (DE); Stephan Voit, Essen (DE)

(72) Inventors: Jürgen Waffner, Essen (DE); Stephan Voit, Essen (DE)

(73) Assignee: innogy SE, Essen (DE)

( * ) Notice: Subject to any disclaimer, the term of this patent is extended or adjusted under 35 U.S.C. 154(b) by 0 days.

(21) Appl. No.: 16/406,946

(22) Filed: May 8, 2019

(65) Prior Publication Data
US 2019/0265283 A1     Aug. 29, 2019

Related U.S. Application Data

(63) Continuation of application No. PCT/EP2017/064920, filed on Jun. 19, 2017.

(30) Foreign Application Priority Data

Nov. 8, 2016   (DE) .................. 10 2016 121 334

(51) Int. Cl.
| *G01R 22/10* | (2006.01) |
| *B60L 53/12* | (2019.01) |
| *B60L 53/60* | (2019.01) |
| *G01R 21/00* | (2006.01) |
| *H02J 7/02* | (2016.01) |

(52) U.S. Cl.
CPC .............. *G01R 22/10* (2013.01); *B60L 53/12* (2019.02); *B60L 53/60* (2019.02); *G01R 21/002* (2013.01); *H02J 7/025* (2013.01)

(58) Field of Classification Search
CPC ........ G01R 22/10; G01R 22/002; B60L 53/60; B60L 53/12
See application file for complete search history.

(56) References Cited

U.S. PATENT DOCUMENTS

| 5,574,362 A | 11/1996 | Fiorina et al. | |
| 2011/0161143 A1* | 6/2011 | Tajima | H02J 5/00 |
| | | | 705/14.1 |

(Continued)

FOREIGN PATENT DOCUMENTS

| DE | 10 2004 062 655 A1 | 7/2006 |
| DE | 10 2006 039 097 A1 | 8/2007 |
| WO | WO 2010/149450 A1 | 12/2010 |

OTHER PUBLICATIONS

Junjun Deng et al., "Development of a High Efficiency Primary Side Controlled 7kW Wireless Power Charger," IEEE Electric Vehicle Conference, 2014, 6 pages.

*Primary Examiner* — Dominic E Hawkins
(74) *Attorney, Agent, or Firm* — Reinhart Boerner Van Deuren P.C.

(57) ABSTRACT

Measuring transducer for electric vehicles having at least one tap arranged to tap at least one AC measurement value in an AC charging circuit, a transformer arranged to convert a frequency of the AC measurement value into a standard frequency of an energy supply grid and to output at least one AC measurement value with the standard frequency in an AC measuring circuit, and at least one standard meter arranged in the AC measuring circuit for detecting an electrical power with the AC measurement value at the standard frequency.

16 Claims, 3 Drawing Sheets

(56) References Cited

U.S. PATENT DOCUMENTS

| | | | |
|---|---|---|---|
| 2011/0285349 A1* | 11/2011 | Widmer | B60L 11/182 320/108 |
| 2012/0235824 A1* | 9/2012 | Tu | G01R 31/50 340/647 |
| 2013/0332014 A1* | 12/2013 | Jackson | B60L 50/51 701/22 |
| 2014/0203768 A1* | 7/2014 | Andic | B60L 53/124 320/108 |
| 2015/0022142 A1* | 1/2015 | Garcia Briz | B60L 53/36 320/108 |
| 2015/0298560 A1* | 10/2015 | Keeling | B60L 53/12 191/10 |
| 2015/0331135 A1* | 11/2015 | Widmer | G01V 3/101 324/234 |
| 2019/0265283 A1* | 8/2019 | Waffner | B60L 53/60 |

* cited by examiner

MEASURING TRANSDUCER FOR ELECTRIC VEHICLES AND A METHOD OF OPERATING A MEASURING TRANSDUCER

CROSS-REFERENCE TO RELATED PATENT APPLICATIONS

This patent application is a continuation of PCT/EP2017/064920, filed Jun. 19, 2017, which claims priority to German Application No. 10 2016 121 334.9, filed Nov. 8, 2016, the entire teachings and disclosure of which are incorporated herein by reference thereto.

FIELD

The subject matter relates to a measuring transducer for electric vehicles and a method of operating a measuring transducer.

BACKGROUND

The increasing use of electrical charging stations for electric vehicles give rise to new challenges with regard to the measurement technology to be used. In particular, technical challenges must be overcome with regard to the correct billing of obtained electrical energy. This applies in particular to the inductive charging of electric vehicles. Suitable measurement technology for inductive charging should be installed in the electric vehicle in order to be able to determine the energy actually drawn by the energy storage device. This is particularly important for inductive charging, as the power dissipation on the transmission path is considerable.

For this reason, the subject matter was based on the object of providing a reliable measurement technology that is available in large quantities, for inductive charging.

BRIEF SUMMARY

This object is solved by a measuring transducer, an electric vehicle and a method according to the present disclosure.

According to the subject matter, the electrical power, provided in an AC charging circuit which is fed by an induction coil and used to charge an energy storage device of the vehicle is measured, in the electric vehicle, in an AC measuring circuit with standard measuring technology for billing purposes.

It has been recognized that neither standard voltages nor standard frequencies are generally used in conventional AC (alternating current) charging circuits for charging electric vehicles. With inductive charging, an alternating electric field is induced in the induction coil of the electric vehicle via an inductive coupling between a coil in a charging station and an induction coil. Depending on the coupling, the number of turns, the frequency and the voltage at the coil in the charging station, an alternating voltage is generated at the induction coil which feeds the AC charging circuit. This alternating voltage is converted in the vehicle by means of a rectifier into a direct voltage, which is used to charge the energy storage. For billing purposes, however, a measurement in the AC charging circuit is preferred.

However, since neither standard voltage nor standard frequency are present in the AC charging circuit, it is not yet possible to measure the electrical power using standard measurement technology. However, standard measurement technology has the advantage that its function has been proven for decades, that it is available in large quantities and has already been approved under the Weights and Measures Act. In order to be able to use the standard measuring technology, the measuring transducer according to the subject matter is proposed which converts the AC measurement value in the AC measuring circuit into at least one AC value at a standard frequency. Standard measurement technology usually works at a standard frequency of 50 Hz or 60 Hz, depending on the grid. This standard frequency is assumed in the measurement technology in order to determine an electrical power from the measured values such as amperage and voltage and over time an electrical energy.

To enable measurement with standard measurement technology, the measuring transducer first comprises a tap for tapping an AC value in an AC charging circuit. The AC charging circuit is in particular the circuit in the electric vehicle connected to the induction coil for inductive coupling to a charging station. In that case the power is measured on the vehicle side. The AC charging circuit can also be the circuit with the induction coil of the charging station. In that case the power is measured on the charging station side. An AC current flows in the AC charging circuit, which is induced on the vehicle side by the inductive coupling with the charging station. The frequency of the AC current, however, depends on the charging technology and in the rarest cases is at standard frequency. For this reason, the measuring transducer also has a transducer set up to convert a frequency of the AC measurement value into a standard frequency of an energy supply grid.

In addition, the transducer has an output which couples an AC measurement value with standard frequency into an AC measuring circuit separated from the AC charging circuit. For example, charging is performed at a frequency greater than 100 Hz. Using the transducer, the frequency is then set from 100 Hz to 50 Hz and an AC value with a frequency of 50 Hz, for example, is coupled into the AC measuring circuit. During frequency conversion, care is naturally also taken to ensure that the electrical power measured on the basis of the AC value with the standard meter corresponds to the electrical power in the AC charging circuit. In particular, the phase position of the measurement values is taken into account so that the active power in the AC measuring circuit corresponds to the active power in the AC charging circuit.

By outputting the AC value at standard frequency, it is possible for the measuring transducer to meter an electrical power with at least a standard meter arranged in the AC measuring circuit. The electrical power is measured via the AC value at the standard frequency and corresponds to the electrical power in the AC charging circuit by suitable scaling.

As already explained, the measuring transducer is preferably used in AC charging circuits which are fed via an induction coil or feed an excitation coil. When induction coils or excitation coils are mentioned in the following, these terms are interchangeable as far as it makes sense. In particular, the measuring transducer can be used for charging and feedback. When charging, the induction coil is in the vehicle and the excitation coil is at the charging station, when feedback, the excitation coil is at the vehicle and the induction coil is at the charging station. Both functions can be realized with the measuring transducer according to the subject matter. In the case of feedback, the charging circuit is to be understood as the supply circuit for the energy supply grid.

An induction coil is provided in the AC charging circuit according to an embodiment. The induction coil serves in the AC charging circuit as a voltage source, in particular as a constant voltage source. The voltage at the taps of the induction coil is preferably dependent on the number of windings of the induction coil, the number of windings of the excitation coil and the input voltage at the excitation coil. There may also be dependencies due to the frequency of the input voltage at the excitation coil.

According to an embodiment, it is proposed that the transformer sets an AC control value at least depending on the AC measurement value. The AC measuring circuit is preferably operated via a constant current source or a constant voltage source and a voltage drop is measured via a defined measuring resistor. To imprint the AC value into the AC measuring circuit, the AC control value is used, which is used in the transducer to set the constant current source and/or the constant voltage source.

According to an embodiment, it is proposed that the transducer is arranged in such a way that the absolute value of the AC value is at least a factor of 10 smaller than the absolute value of the AC measurement value. In order to keep the power loss in the AC measuring circuit as low as possible, it is advantageous if the absolute value of the AC value is smaller than the absolute value of the AC measurement value, preferably by at least a factor of 10. Then very little power drops across the measuring resistor in the AC measuring circuit and the AC measuring circuit can be operated with a power loss which is also lower by a factor of 10 or more than the power loss on the transmission path between the excitation coil and the induction coil. This is important because the measurement technology should have as little power dissipation as possible.

According to an embodiment, it is proposed that the at least one AC measurement value comprises at least one alternating voltage and/or one AC current. A voltage can be tapped off via a measuring resistor in the AC charging circuit and a further voltage can be tapped off parallel to the energy storage. The voltage across the measuring resistor is preferably proportional to the current in the AC charging circuit, so that an AC current across the measuring resistor can be determined. The detected AC current together with the alternating voltage can be used to determine the active power in the AC charging circuit, particularly depending on their phase position relative to each other. The output of the AC values, such as alternating voltage and AC current in the AC measuring circuit, takes place at standard frequency.

As already mentioned, the active electrical power is essential for the billing of the obtained energy. For this reason, the electrical power in the AC measuring circuit is metered as active electrical power. In particular, the phase angles between the AC measurement values play a role here, which is preferably reflected in the AC values impressed into the AC measuring circuit. This means that the AC values preferably have the same phase position relative to each other as the AC measurement valued, in particular that the phase position between AC measurement voltage and AC measurement current is the same as the phase position between alternating voltage and AC current in the AC measuring circuit.

As standard meters, for example, Ferraris meters or smart meters are used, which are designed in particular for very small powers, in particular powers which are smaller by a factor of 1000 to 5000 than the powers which are relevant in the AC charging circuit. Preferably, these standard meters are also designed for other frequencies than the frequency in the AC charging circuit.

By suitable scaling of the AC value compared to the AC measurement value, it is possible to keep the AC value in the AC measuring circuit, in particular the active power, a constant factor lower than the active power made available via the AC charging circuit. Conversion factors of 1000 or 5000 are quite conceivable. Corresponding AC meters are available which carry out a corresponding upscaling and output the measured active electrical power in the AC measuring circuit multiplied by the known factor as the measured electrical power, or taking into account the time, as electrical energy.

The transducer usually has a constant conversion factor, for example a conversion factor corresponding to the meter. Depending on how the conversion is carried out in the AC meter, the AC control value can be set as a function of the AC measurement value.

According to an embodiment, it is proposed that the transducer arranged in such a way that the absolute value of the AC value is at least a factor of 10 smaller than the absolute value of the AC measurement value. However, factors of 100 are preferred, for example 1000 or even 5000. Corresponding AC meters are available, which output the measured AC value multiplied by a corresponding factor. Thus the output of the measured value on the AC meter is according to the AC measurement value, although from AC measurement value to AC value a scaling downwards has initially taken place. This scaling is compensated accordingly in the AC meter.

In order to ensure that active power is preferably consumed in the AC measuring circuit, the AC measuring circuit can be optimized with regard to parasitic capacitive or inductive loads. Preferably only an ohmic resistor is provided in the AC measuring circuit. The active electrical power is preferably lower by a factor than the electrical power in the AC charging circuit.

According to an embodiment, it is proposed that the tap is arranged parallel to at least one measuring resistor. The AC measurement value, in particular the AC current in the AC charging circuit, is preferably measured via an ohmic resistor, in particular a measuring resistor. The measuring resistor is subject to temperature fluctuations, so that the amperage determined via the voltage drop over the measuring resistor can be temperature-dependent. In order to be able to carry out temperature compensation in the AC measuring circuit, a temperature in the AC charging circuit is also measured in addition to the AC measurement values, preferably according to an embodiment. The temperature is preferably measured by a temperature sensor. The temperature is preferably measured at the measuring resistor. The temperature sensor is preferably located on the AC charging circuit. The temperature sensor is preferably located directly at the measuring resistor and thus measures the temperature of the measuring resistor. The AC value is then additionally determined depending on the measured temperature of the temperature sensor. This makes it possible to make the amperage of the AC charging circuit, which is determined due to the voltage drop across the measuring resistor, available in the AC measuring circuit in temperature-compensated form.

The measured AC measurement value, in particular the alternating voltage as well as the AC current, can first be scaled in a scaler in order to be fed, for example, to an analog-to-digital transducer. The analog-to-digital transducer usually has a limited resolution. In order to exclude errors due to inaccurate quantization, it is proposed to first perform scaling of the AC measurement values via an operational amplifier in order to reduce their value dynamics, in particular the amplitude of the measured values.

According to an embodiment, it is proposed that at least one absolute value of AC current in the AC charging circuit and one absolute value of a voltage, in particular across an energy storage in the AC charging circuit, can be measured via the tap as AC measurement values. In order to enable the active power in the AC measuring circuit to be synchronised with the active power in the AC charging circuit, both the alternating voltage and the AC current can be measured in the AC measuring circuit. This measurement can also be used to determine a phase angle between the AC current and the alternating voltage. Information derived from this about an active power in the AC measuring circuit can be fed back to the transducer. There this value can be used as feedback to the reference value of the AC measurement value in order to set the AC value. The AC values measured in the AC measuring circuit can be fed back to the transducer either together or independently of each other in order to enable control of the AC value or the AC control value.

The frequency in the AC charging circuit is preferably different from a standard frequency of a grid. It is proposed that a frequency of AC values in the AC measuring circuit is in particular 50 Hz or 60 Hz with a variance of +/−3%.

In order to enable an accurate measurement of the AC power in the AC measuring circuit, it is proposed that a constant current source is provided in the AC measuring circuit. The constant current source is set depending on the AC control value. A constant AC current flows via the constant current source into the AC measuring circuit, which is measured together with the alternating voltage in the meter and thus an active power and, taking into account the time, an active energy is measured.

The constant current source is preferably an adjustable resistor or has such an adjustable resistor. With the help of the adjustable resistor it is possible to adjust the current flow into the AC measuring circuit. If, for example, the AC measuring circuit is operated with 230 V, a current flow in the AC measuring circuit can be 200 mA, for example, depending on the current flow in the AC charging circuit, by suitable setting of the resistor. Thus this results in an active power of 46 W in the AC measuring circuit. This active power is measured by the AC meter and an active energy is output.

An active power of 46 W at a scaling factor of 1000, such as that which can be set in the transducer, can correspond to an AC power in the AC charging circuit of 46 kW. This means that if an electric vehicle charges with 46 kW in the AC charging circuit, the AC measuring circuit consumes accordingly only 46 W "measuring power". An even higher factor leads to an even lower consumption of "measuring power" in the AC measuring circuit, which increases the efficiency of the measuring transducer.

According to an embodiment, it is proposed that the transducer sets the AC value so that the active electrical power in the AC circuit is a constant factor smaller than the electrical power in the AC charging circuit. The factor, as mentioned, is preferably over a 100, especially over 1000, or 5000. The factor can be particularly dependent on the type of energy meter in the AC measuring circuit. If an energy meter with a factor of 5000 is used, the factor can also be set to 5000 via the transducer.

In order to keep the electrical power in the measuring circuit as low as possible, it is proposed that the AC measuring circuit is a single-phase AC measuring circuit.

Another aspect is a method according to the present disclosure.

The AC measurement is preferably measured at short intervals in order to be able to represent the measured current electrical power as accurately as possible. Only then is the measured electrical energy as accurate as possible an image of the electrical energy made available. For this reason, it is proposed that the intervals be less than 1 second, preferably less than 100 ms, in particular 10 ms.

BRIEF DESCRIPTION OF THE DRAWING

In the following, the subject matter is explained in more detail using a drawing showing embodiments. In the drawing show.

DETAILED DESCRIPTION

Figure 1:
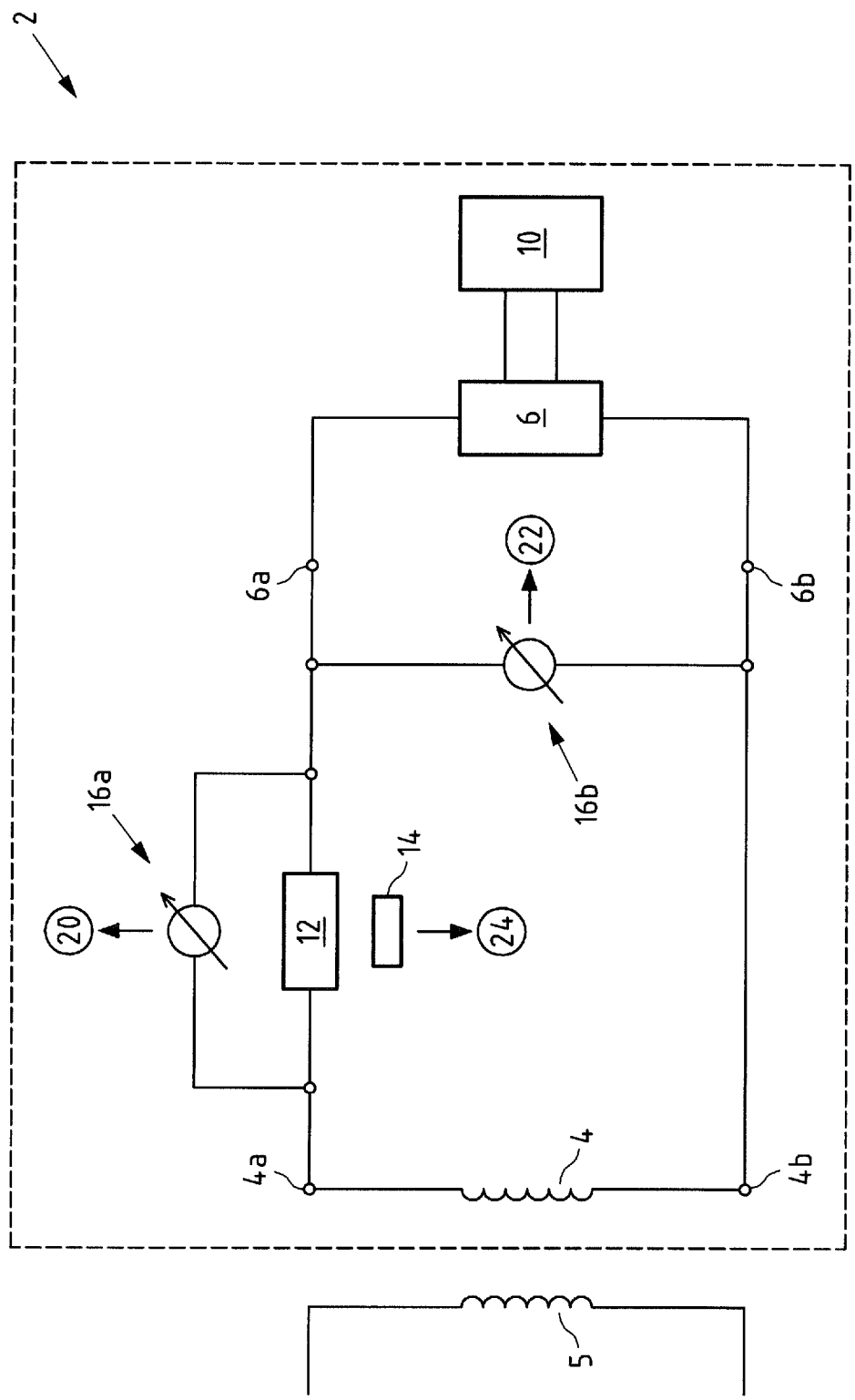
FIG. 1 shows an AC charging circuit in an electric vehicle.

FIG. 1 schematically shows the structure in an electric vehicle 2 with an induction coil 4. An alternating voltage is applied to the induction coil 4 at terminals 4a, 4b, via which an energy storage of the electric vehicle can be charged. For this purpose, an AC/DC transducer 6 is connected to the AC charging circuit, which is arranged to supply the energy storage 10. The charging process in the AC charging circuit 8 can be set via a charging controller, in particular the AC current in the AC charging circuit 8 can be set. The AC charging circuit 8 is usually designed for powers of more than 10 kW, preferably more than 40 kW, in particular more than 70 kW electrical power. The induction coil 4 is coupled to an excitation coil 5 of a charging station and electrical power is coupled into the AC charging circuit 8 via the magnetic coupling.

For the sake of clarity, the AC charging circuit 8 is only shown with the measuring equipment relevant for the measuring transducer according to the subject-matter. Charging an electric vehicle naturally requires additional technical equipment, which is not shown here for the sake of clarity.

A measuring resistor 12 is provided in the AC charging circuit 8. The measuring resistor 12 is usually a measuring shunt which has a constant current/voltage curve over a wide temperature range. The measuring shunt can be made of for example Manganin.

The measuring resistor 12 taps the voltage drop with a voltmeter 13. From this voltage value, the amperage in the AC charging circuit 8 can be derived if both the temperature and the current-voltage characteristic of the measuring resistor 12 are known. This value is output as an AC measurement value 20.

In addition, an alternating voltage is measured by a voltmeter 16b across load 6 and output as an alternating voltage measurement value 22.

In addition, a temperature sensor 14 is provided, which is preferably arranged directly on the measuring resistor 12 and thus preferably measures the temperature of the measuring resistor 12. The temperature sensor 14 outputs a measured temperature value of 24.

Figure 2:
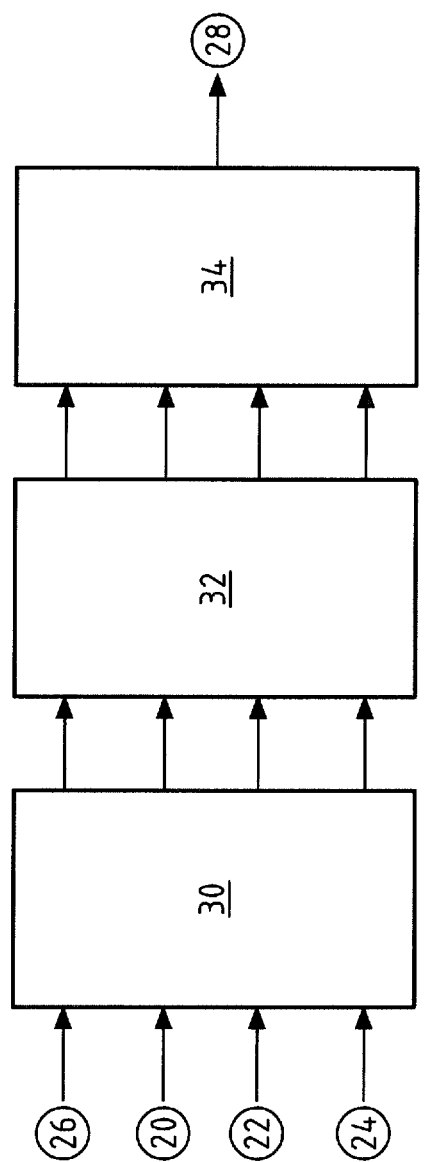
FIG. 2 shows a transducer.

The measurement values measured in the AC charging circuit 8 are then first fed to a scaling device 30, as shown in FIG. 2.

In the scaling device 30, in particular the AC measurement value 20 and the alternating voltage measurement value 22 are scaled in order to ensure in particular a lower amplitude of the measurement values in terms of absolute amount. Scaling can be carried out for one, several or all measurement values. In addition, a power measurement value 26 is fed back to the scaler 30, which is recorded as described below.

All measurement values are then fed to an analog-to-digital transducer 32 and the then digitized measurement values are then fed to a transducer 34. In transducer 34, the AC measurement values are converted into an AC output value 28 as a function of the temperature measurement value 24 and the feedback power measured value 26.

First, the alternating voltage value 22 and the AC current value 20 are used to determine an electrical power in the AC charging circuit 8. After or before this, the measured temperature value 24 can be used to calculate a temperature drift from the AC measurement value 20. If the measuring resistor 12 does not have a constant current/voltage characteristic curve over the entire temperature range, a temperature drift can be taken into account on the basis of the temperature measured value and the voltage actually flowing in the AC charging circuit 8 can thus be determined from the voltage measured via the resistor 12. After temperature adjustment, the charging power in the AC charging circuit 8 can then be determined.

In addition, the frequency in the AC charging circuit 8 can be determined. Furthermore, the phase position can be determined from the charge current and charge voltage in order to determine the active power in charge circuit 8.

Depending on a factor, for example 1.000, an AC control value can be determined. The factor can be applied, for example, to the charging power. If, for example, the charging power is 1 kW, given a factor of 1,000, the AC control value results in 1 W. A linear conversion of the AC measurement value into an AC control value is preferred.

The AC control value 28 is output at transducer 34 and is used, for example, to convert to an AC current at a standard frequency.

Figure 3:
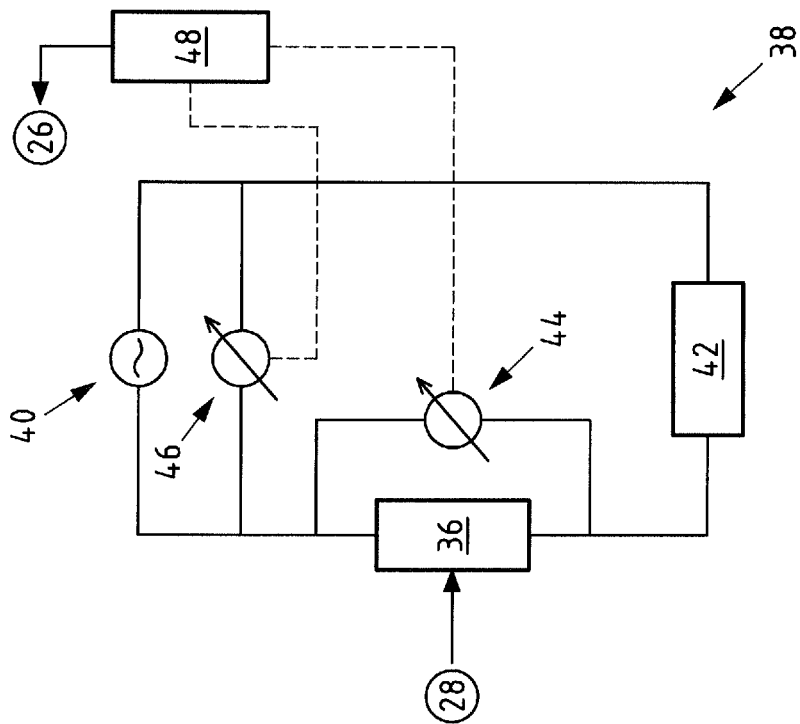
FIG. 3 shows an AC measuring circuit.

The AC control value 28 is fed to a constant current source 36, as shown in FIG. 3. The constant current source 36 usually has an adjustable resistor. The current can be adjusted via the constant current source 36 via the resistor. The resistance, which is set in the constant current source 36, is determined by the voltage in the AC measuring circuit 38 and the AC control value 28. If, for example, the electrical power in the charging circuit 8 is 23 kW, an AC power of 23 W results with a factor of 1,000 in the transducer 34. With an alternating voltage of 230 V AC at standard frequency and a power factor cosphi of 1, this results in an AC current value of 0.1 ampere. This amperage leads to an adjustment of the resistance in the constant current source 36 to 2.3 k$\Omega$. It should be mentioned that this is purely exemplary and that the constant current source 36 can also be operated with other values depending on the factor and other boundary conditions.

The frequency of the AC values is preferably set to a standard value of 50 Hz or 60 Hz.

The AC measuring circuit 38 is in particular a single-phase measuring circuit and has a standard meter 42 in addition to the constant current source 36. The standard meter 42 meters in particular the active electrical power or active energy consumed in the AC measuring circuit 38 at standard frequency. Please note that the standard meter 42 as the electricity meter is set to a standard frequency and only measures correctly at standard frequency. The standard frequency is usually 50 Hz or 60 Hz, depending on the electrical energy supply grid.

In the above example, the power is 23 W, for example. If this occurs constantly for over an hour, i.e. if the vehicle is constantly charging with 23 kW for over an hour, for example, and has thus obtained an electrical energy of 23 kWh, the standard meter 42 measures 23 Wh. However, the measured value output could be 23 kWh if the energy meter 42 has a corresponding conversion factor of 1,000.

To check the active power consumed in the AC measuring circuit 38 in relation to the electrical power in the AC charging circuit 8, a current and a voltage are metered in the AC measuring circuit 38. The current in the AC measuring circuit 38 is preferably measured via a voltmeter 44, which measures the voltage drop via the constant current source 36. The alternating voltage is measured by a voltmeter 46. In addition, a phase angle between current and voltage can be detected. The measured values derived from this are fed to an evaluation circuit 48 and in the evaluation circuit 48 the active power consumed in the AC measuring circuit 38 is determined on the basis of the measured values. This active power can be coupled-out as power measured value 26 and fed to the scale 30 as shown in FIG. 2.

Finally, the measured power value 26 is fed to the transducer 34 and can be compared with the AC control value. These two values must correspond to each other, otherwise a control, in particular a P control, a PI control or a PID control can be carried out in the transducer 34 in order to achieve a synchronism from the measured AC measurement value and the set AC value.

With the help of the measuring transducer, it is possible to meter measurement values relevant for billing purposes at a standard meter at standard frequency in a particularly simple and cost-effective way.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An electric vehicle, comprising:
   an induction coil in an AC charging circuit for inductive coupling with a charging station and for receiving electrical power via an excitation coil for charging an energy storage, and
   a measuring transducer comprising:
   at least one tap arranged to tap at least one AC measured value in an AC charging circuit which comprises the induction coil,
   a converter arranged for converting a frequency of the AC measured value into a standard frequency of a energy supply grid, and for outputting at least one AC value with the standard frequency into an AC measuring circuit, and
   at least one standard meter arranged in the AC measuring circuit for obtaining an electrical power using the AC value at the standard frequency.

2. The electric vehicle according to claim 1, wherein the AC charging circuit has at least one induction coil as a constant voltage source.

3. The electric vehicle according to claim 1, wherein the converter sets an AC control value at least as a function of the AC measured value and outputs the AC value as a function of the AC control value.

4. The electric vehicle according to claim 1, wherein the at least one AC measured value comprises at least one alternating voltage and/or one alternating current and in that the at least one AC value comprises at least one alternating voltage and/or one alternating current at standard frequency.

5. The electric vehicle according to claim 1, wherein that the electrical power measured is an active electrical power.

6. The electric vehicle according to claim 1, wherein that the standard meter is in particular a Ferraris Meter or a Smart Meter.

7. The electric vehicle according to claim 1, wherein the tap is arranged parallel to at least one measuring resistor.

8. The electric vehicle according to claim 1, wherein a frequency in the AC charging circuit deviates from a standard frequency of an energy supply grid and in that the standard frequency in the AC measuring circuit is in particular 50 Hz or 60 Hz +/−3%.

9. The electric vehicle according to claim 1, wherein the constant current source has at least one resistance which can be set as a function of the AC control value.

10. The electric vehicle according to claim 1, wherein that the AC measuring circuit is a single-phase AC circuit.

11. An electric vehicle, comprising:
    an induction coil in an AC charging circuit for inductive coupling with a charging station and for receiving electrical power via an excitation coil for charging an energy storage, and
    a measuring transducer comprising:
    at least one tap arranged to tap at least one AC measured value in an AC charging circuit which comprises the induction coil,
    a converter arranged for converting a frequency of the AC measured value into a standard frequency of a energy supply grid, and for outputting at least one AC value with the standard frequency into an AC measuring circuit, and
    at least one standard meter arranged in the AC measuring circuit for obtaining an electrical power using the AC value at the standard frequency;
    wherein the converter arranged in such a way that the absolute value of the AC value is smaller by at least a factor of ten than the absolute value of the AC measured value.

12. An electric vehicle, comprising:
    an induction coil in an AC charging circuit for inductive coupling with a charging station and for receiving electrical power via an excitation coil for charging an energy storage, and
    a measuring transducer comprising:
    at least one tap arranged to tap at least one AC measured value in an AC charging circuit which comprises the induction coil,
    a converter arranged for converting a frequency of the AC measured value into a standard frequency of a energy supply grid, and for outputting at least one AC value with the standard frequency into an AC measuring circuit, and
    at least one standard meter arranged in the AC measuring circuit for obtaining an electrical power using the AC value at the standard frequency;
    wherein at least one absolute value of the alternating current in the AC charging circuit and an absolute value of a voltage across an energy storage in the AC charging circuit can be detected via the tap as AC measured values.

13. An electric vehicle, comprising:
    an induction coil in an AC charging circuit for inductive coupling with a charging station and for receiving electrical power via an excitation coil for charging an energy storage, and
    a measuring transducer comprising:
    at least one tap arranged to tap at least one AC measured value in an AC charging circuit which comprises the induction coil,
    a converter arranged for converting a frequency of the AC measured value into a standard frequency of a energy supply grid, and for outputting at least one AC value with the standard frequency into an AC measuring circuit, and
    at least one standard meter arranged in the AC measuring circuit for obtaining an electrical power using the AC value at the standard frequency;
    wherein the AC current measuring circuit has a constant current source and in that the constant current source feeds a constant alternating current into the AC current measuring circuit as a function of the AC current control value.

14. An electric vehicle, comprising:
    an induction coil in an AC charging circuit for inductive coupling with a charging station and for receiving electrical power via an excitation coil for charging an energy storage, and
    a measuring transducer comprising:
    at least one tap arranged to tap at least one AC measured value in an AC charging circuit which comprises the induction coil,
    a converter arranged for converting a frequency of the AC measured value into a standard frequency of a energy supply grid, and for outputting at least one AC value with the standard frequency into an AC measuring circuit, and
    at least one standard meter arranged in the AC measuring circuit for obtaining an electrical power using the AC value at the standard frequency;

wherein the converter sets the AC value in such a way that the active electrical power in the AC measuring circuit is a constant factor smaller than the electrical power in the AC charging circuit.

15. A charging station, comprising:
an excitation coil within an AC charging circuit and arranged for inductive coupling with an electric vehicle and for feeding an induction coil of the electric vehicle and a measuring transducer comprising:
at least one tap arranged to tap at least one AC measured value in an AC charging circuit which comprises the induction coil,
a converter arranged for converting a frequency of the AC measured value into a standard frequency of a energy supply grid, and for outputting at least one AC value with the standard frequency into an AC measuring circuit, and
at least one standard meter arranged in the AC measuring circuit for obtaining an electrical power using the AC value at the standard frequency.

16. A method for operating an electric vehicle or a charging station, comprising the steps of:
measuring at least one AC measured value in an AC charging circuit comprising an induction coil of an electric vehicle or an excitation coil of a charging station, and
operating an AC measuring circuit using an AC value,
wherein the AC value is fed into the AC measuring circuit at a standard frequency which is different from the frequency of the AC charging circuit, and
wherein, within the AC measuring circuit, a standard meter obtains the AC value at the standard frequency.

* * * * *